(12) United States Patent
Sun

(10) Patent No.: US 9,702,635 B2
(45) Date of Patent: Jul. 11, 2017

(54) LOOP HEAT PIPE STRUCTURE WITH LIQUID AND VAPOR SEPARATION

(71) Applicant: COOLER MASTER CO., LTD., New Taipei (TW)

(72) Inventor: Chien-Hung Sun, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 259 days.

(21) Appl. No.: 14/587,685

(22) Filed: Dec. 31, 2014

(65) Prior Publication Data

US 2016/0187069 A1    Jun. 30, 2016

(51) Int. Cl.
*H05K 7/20* (2006.01)
*F28D 15/04* (2006.01)
*H01L 23/427* (2006.01)

(52) U.S. Cl.
CPC ............ *F28D 15/043* (2013.01); *F28D 15/04* (2013.01); *H01L 23/427* (2013.01); *H05K 7/20336* (2013.01)

(58) Field of Classification Search
CPC ..... F28D 14/04; F28D 14/043; H01L 23/427; H05K 7/20336
USPC ......................... 165/104.26, 104.33; 361/700
See application file for complete search history.

(56) References Cited

U.S. PATENT DOCUMENTS

| | | | | |
|---|---|---|---|---|
| 3,986,550 A | * | 10/1976 | Mitsuoka ............... | H01L 23/427 165/104.26 |
| 4,018,269 A | * | 4/1977 | Honda ................... | F28D 15/046 165/104.26 |
| 5,046,553 A | * | 9/1991 | Lindner ................. | F28D 15/046 165/104.26 |
| 6,005,772 A | * | 12/1999 | Terao .................... | H01L 23/427 165/104.33 |
| 6,269,865 B1 | * | 8/2001 | Huang ................... | F28D 15/043 165/104.26 |
| 6,549,408 B2 | * | 4/2003 | Berchowitz ........... | H01L 23/427 361/700 |
| 7,051,794 B2 | * | 5/2006 | Luo ........................ | F28D 15/04 165/104.26 |
| 7,093,647 B2 | * | 8/2006 | Take ...................... | F28D 15/04 165/104.26 |
| 7,317,616 B2 | * | 1/2008 | Li ......................... | F28D 15/043 361/700 |

(Continued)

*Primary Examiner* — Leonard R Leo
(74) *Attorney, Agent, or Firm* — Maschoff Brennan

(57) ABSTRACT

A loop heat pipe structure with a liquid and vapor separation includes an evaporation chamber and a loop pipe. The evaporation chamber includes two connecting ports, and an inner wall of the evaporation chamber includes a liquid-preservation capillary structure. The loop pipe includes two evaporation channel tubular portions and a condensation tubular portion connected between the two evaporation channel tubular portions; and the two evaporation channel tubular portions are connected to the two connecting ports of the evaporation chamber respectively. Wherein each one of the evaporation channel tubular portions includes an inner tube and an outer tube; the inner tube is sleeved inside the outer tube; and a flow-returning capillary structure is disposed between the outer tube and the inner tube inside the outer tube; the flow-returning capillary structure extends into the evaporation chamber and is in contact with the liquid-preservation capillary structure.

10 Claims, 6 Drawing Sheets

(56) References Cited

U.S. PATENT DOCUMENTS

| | | | | |
|---|---|---|---|---|
| 7,543,630 | B2* | 6/2009 | Lai | F28D 15/04 |
| | | | | 165/104.26 |
| 8,016,024 | B2* | 9/2011 | Kang | F28D 15/043 |
| | | | | 165/104.26 |
| 8,705,236 | B2* | 4/2014 | Uchida | F28D 15/043 |
| | | | | 165/104.26 |
| 9,052,147 | B2* | 6/2015 | Xiang | H01L 23/427 |
| 9,441,888 | B2* | 9/2016 | Chang | H05K 7/20336 |
| 9,500,413 | B1* | 11/2016 | Rice | F28D 15/04 |
| 9,504,185 | B2* | 11/2016 | Xiang | H01L 23/427 |
| 2005/0178532 | A1* | 8/2005 | Meng-Cheng | H01L 23/427 |
| | | | | 165/104.33 |
| 2009/0308576 | A1* | 12/2009 | Wang | B23P 15/26 |
| | | | | 165/104.26 |
| 2010/0263836 | A1* | 10/2010 | Figus | F28D 15/043 |
| | | | | 165/104.26 |

* cited by examiner

LOOP HEAT PIPE STRUCTURE WITH LIQUID AND VAPOR SEPARATION

BACKGROUND OF THE INVENTION

Field of the Invention

The present invention is related to a thermal conductive unit, in particular, to a loop heat pipe structure with a liquid and vapor separation.

Description of Related Art

Typically, a conventional loop heat pipe is constructed by a loop pipe with a suitable amount of working fluid sealed and stored therein, and an evaporation portion and a condensation portion are separately form on the pipe. In addition, in terms of the design, the flow direction of the vapor phase of the working fluid and the flow direction of the liquid phase thereof need to be considered in order to allow the working fluid to be able to flow from the evaporation portion to the condensation portion after being vaporized as well as to allow the condensed liquid phase of the working fluid to flow back to the evaporation portion from another portion of the pipe and from the condensation portion thereof. As a result, the problem associated with the conflicts of the flow directions of the vapor phase and the liquid phase of the working fluid can be prevented.

However, for actual uses, due to the drawback that the loop pipe has a high thermal resistance at low wattage and the temperature difference between the evaporation end and the condensation end is too great, it cannot be widely applied to conventional electronic consumer products.

In view of the above, the inventor seeks to overcome the problems associated with the currently existing technique after years of research and development along with the utilization of theoretical principles, and it is an objective of the inventor to provide a reasonable design and an improvement capable of effectively solve the aforementioned problems.

SUMMARY OF THE INVENTION

An objective of the present invention is to provide a loop heat pipe structure with a liquid and vapor separation such that it is capable of separating the flows of the liquid phase and vapor phase of the working fluid in order to solve the problem of conflicts of flow directions of the working fluid of different phases inside the pipe. In addition, with such design of loop pipe, there is no need to consider the problem of the directions of the flows of the working fluid inside the loop pipe.

To achieve the aforementioned objective, the present invention provides a loop heat pipe structure with a liquid and vapor separation, comprising an evaporation chamber and a loop pipe. The evaporation chamber is of a hollow internal and includes two connecting ports connected to the internal thereof; and an inner wall of the evaporation chamber includes a liquid-preservation capillary structure. In addition, the loop pipe includes two evaporation channel tubular portions and a condensation tubular portion connected between the two evaporation channel tubular portions; and the two evaporation channel tubular portions are connected to the two connecting ports of the evaporation chamber respectively. Wherein each one of the evaporation channel tubular portions comprises an inner tube and an outer tube; the inner tube is sleeved inside the outer tube; and a flow-returning capillary structure is disposed between the outer tube and the inner tube inside the outer tube; the flow-returning capillary structure extends into the evaporation chamber and is in contact with the liquid-preservation capillary structure.

DETAILED DESCRIPTION OF THE INVENTION

The following provides a detailed description and technical content of the present invention along with the accompanied drawings. However, the accompanied drawings are provided for illustrative purposes only, which shall not be treated as limitations of the present invention.

Figure 1:
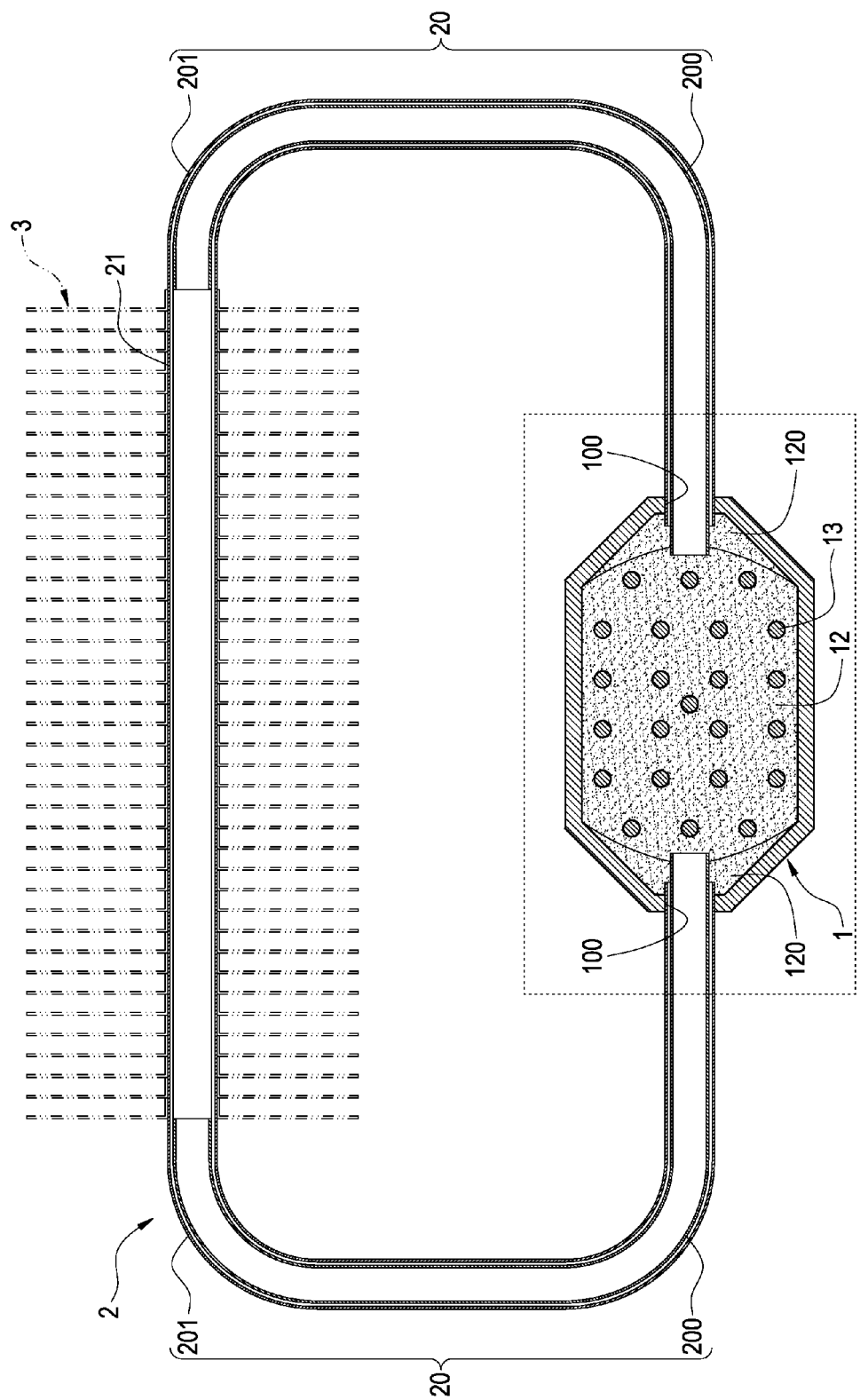
FIG. 1 is an illustrative plane view showing an internal structure of a first embodiment of the present invention.
Figure 2:
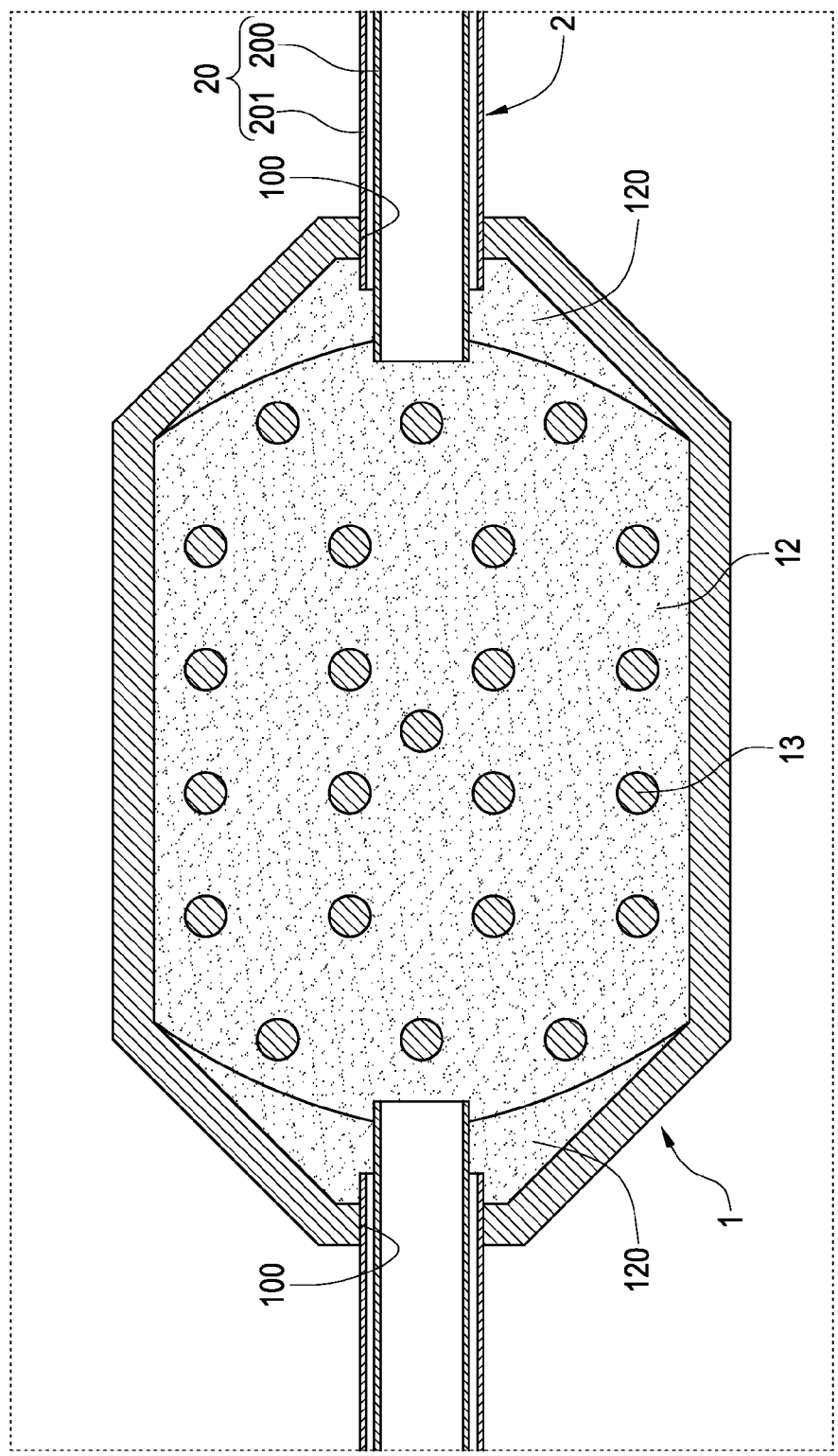
FIG. 2 is a partially enlarged view according to FIG. 1.
Figure 3:
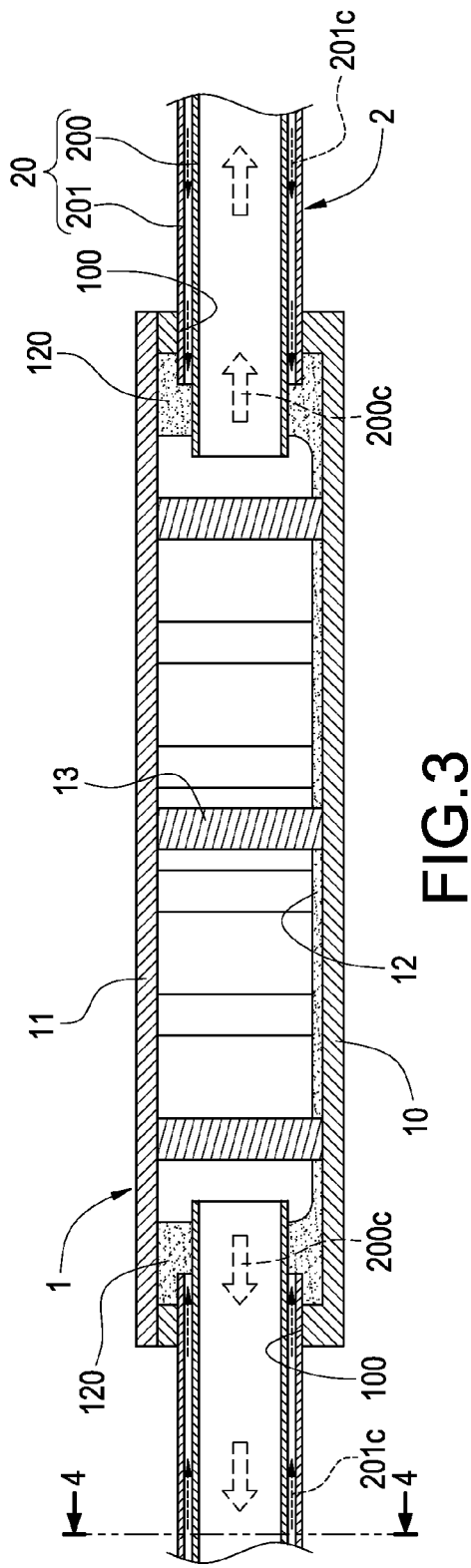
FIG. 3 is a cross sectional view according to FIG. 2.

Please refer to FIG. 1, showing an illustrative plane view of an internal structure of a first embodiment of the present invention. The present invention provides a loop heat pipe structure with a liquid and vapor separation, generally comprising an evaporation chamber 1 and a loop pipe 2; wherein: an internal of the evaporation chamber 1 is of a hollow shape and is used for sealing and storing a suitable amount of working fluid (not shown in the figure) therein. In the embodiment exemplarily illustrated by the present invention, as shown in FIG. 2 and FIG. 3, the evaporation chamber 1 can be constructed by a base 10 and an upper cover 11. In addition, an inner wall of the evaporation chamber 1 includes a liquid-preservation capillary structure 12 disposed thereon; the liquid-preservation capillary structure 12 can be formed by metal power sintering at the rear of the wall surface or can be made of a metal mesh as well as other types of capillary structure. Furthermore, a plurality of supporting member 13 are formed between the base 10 and the upper cover 11 of the evaporation chamber 1 in order to provide a gap between the base 10 and the upper cover 11 such that the problem of indentations caused by the process of air removal or extraction for vacuum of the evaporation chamber 1 can be prevented.

Figure 4:
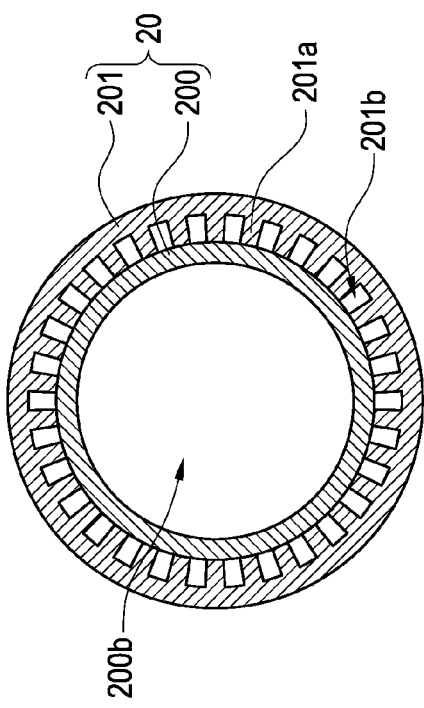
FIG. 4 is a cross sectional view taken along line 4-4 according to FIG. 3.

The loop pipe 2 includes two evaporation channel tubular portions 20 and a condensation tubular portion 21 connected between the two evaporation channel tubular portions 20; and the two evaporation channel tubular portions 20 are connected to two connecting ports 100 of the aforementioned evaporation chamber 1 respectively in order to form a loop path. Please refer to FIGS. 3 and 4. Each one of the evaporation channel tubular portions 20 further comprises an inner tube 200 and an outer tube 201; the inner tube 200 is sleeved inside the outer tube 201. In addition, a flow-returning capillary structure 201a is disposed between the outer tube 201 and the inner tube 200 inside the outer tube 201; the flow-returning capillary structure 201a can be formed at the grooves on the inner wall of the outer tube 201 in order to use the gap between the grooves as the flow-returning channel 201b; and the internal of the inner tube 200 is provided as the evaporation channel 200b. Furthermore, the flow-returning capillary structure 201a extends into the aforementioned evaporation chamber 1 and is in contact with the liquid-preservation capillary structure 12 of the evaporation 1. Moreover, as shown in FIG. 1 again, the outer tube 201 and the condensation tubular portion 21 are connected to each other in order to be integrally formed as one piece such that it allows the evaporation channel 200b and the flow-returning channel 201b both to be connected to the condensation tubular portion 21. In addition, the condensation tubular portion 21 can further include a plurality of fins 3 formed thereon in order to provide or enhance the condensation effect.

Accordingly, with the aforementioned structural assembly, the loop heat pipe structure with a liquid and vapor separation of the present invention can be achieved.

Based on the above, as shown in FIG. 1 to FIG. 3, when the evaporation chamber 1 contacts a heat generating source (not shown in the figures), the working fluid inside the evaporation chamber 1 is turned from the liquid phase to the vapor phase such that it travels outward in all directions from any one of the ports 100 or both two ports 100 of the evaporation chamber 1 as well as further into the evaporation channel 200b with a less resistance via the inner tube 200 of the evaporation channel tubular portions 20 in order to follow the evaporation channel direction 200c indicated in FIG. 3 into the condensation tubular portion 21. Next, when the working fluid is inside the condensation tubular portion 21, it is cooled to return back to the liquid phase from the vapor phase. At this time, the working fluid returning back to the liquid phase is then adhered onto the tubular wall of the condensation tubular portion 21 such that it is able to flow into the flow-returning channel 201b in order to be drawn by the flow-returning capillary structure 201a and to follow the flow-returning direction 201c indicated in FIG. 3 back to the evaporation chamber 1; consequently, the liquid-preservation capillary structure 12 inside the chamber 1 is able to receive and to contact with the working fluid in liquid phase flowing back thereto. Therefore, the flow direction of the vapor phase of the working fluid and the flow direction of the liquid phase of the working fluid can be divided to travel in the evaporation channel tubular portions 20 of the loop pipe 2 respectively such that the occurrence of the interference caused by the flow direction conflicts between the vapor phase and liquid phase of the working fluid can be prevented while at the same time, for the design of the loop heat pipe, there is no need to consider the problem of the flow directions of the working fluid.

It shall be noted that: as shown in FIG. 3, to facilitate the working fluid of the vapor phase to enter into the evaporation channel 200b from the evaporation chamber 1, the inner tube 200 of each one of the evaporation channel tubular portions 20 protrudes further than the outer tube 201 into the evaporation chamber 1. In addition, to facilitate the contact and connection between the liquid-preservation capillary structure 12 and the flow-returning capillary structure 201a, the liquid-preservation capillary structure 12 can extend to an end of the outer tube 201 protruding into the evaporation chamber 1 in order to form a capillary covering portion 120 in order to be in contact with the flow-returning capillary structure 201a disposed between the inner and outer tubes 200, 201.

Figure 5:
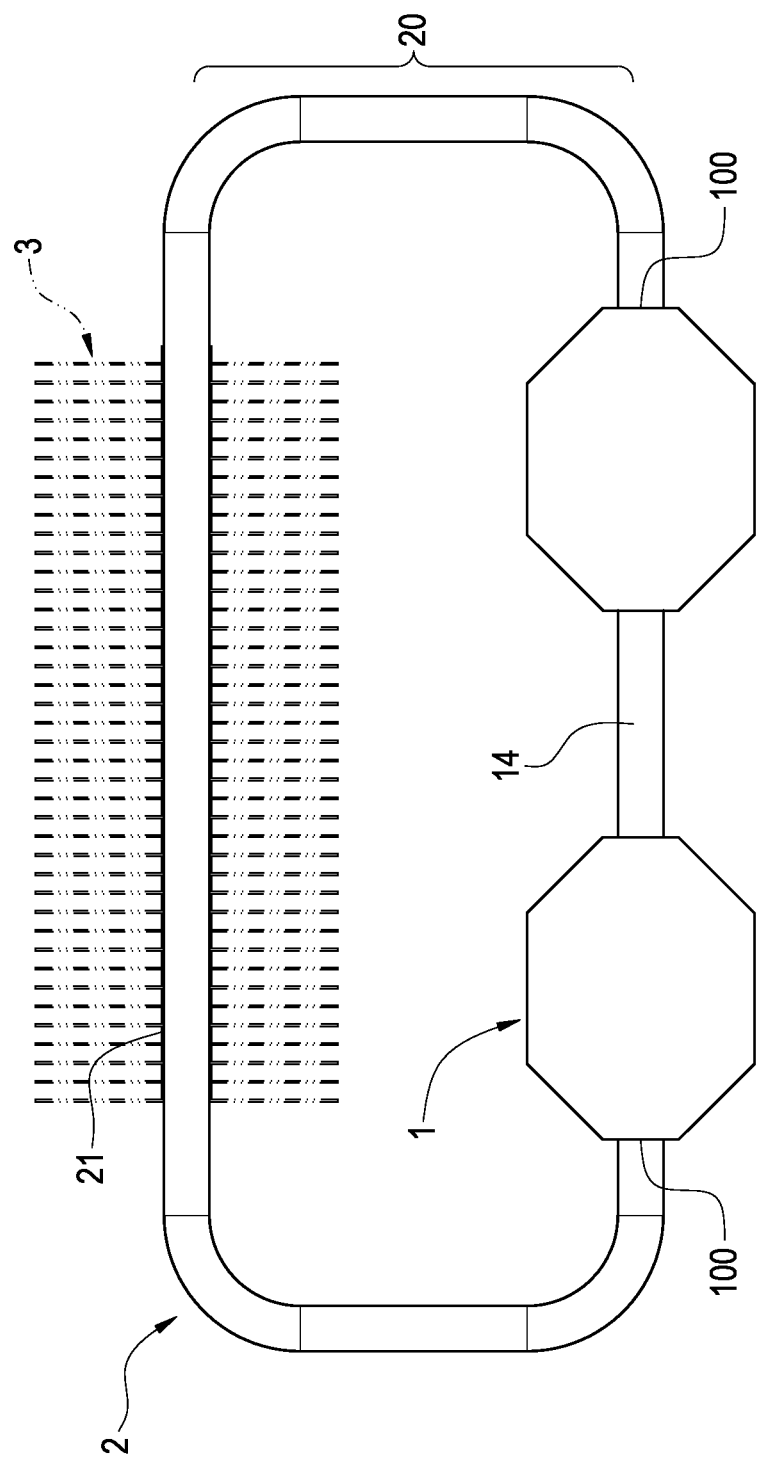
FIG. 5 is an illustrative plane view showing an internal structure of a second embodiment of the present invention.
Figure 6:
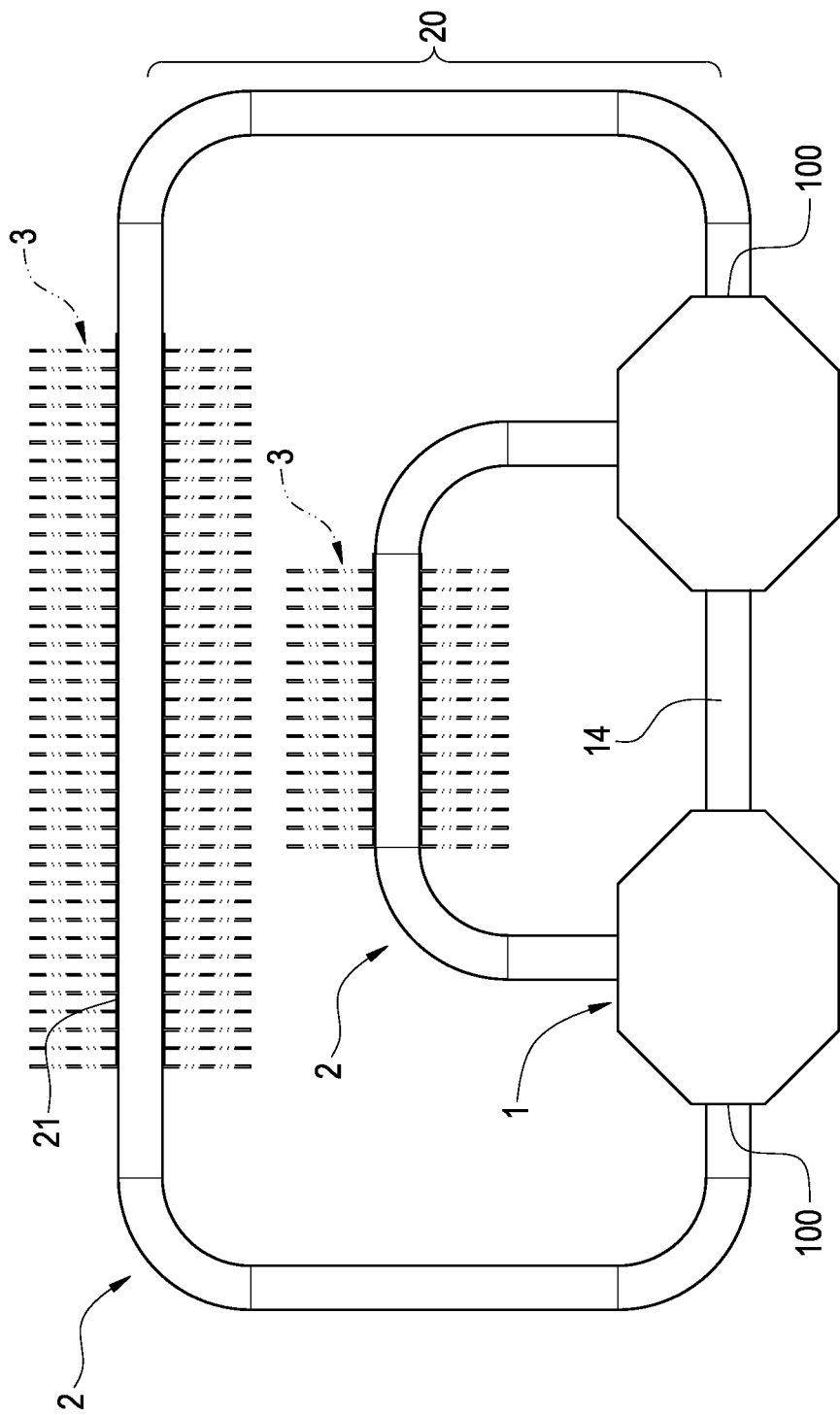
FIG. 6 is an illustrative plane view showing an internal structure of a third embodiment of the present invention.
Figure 7:
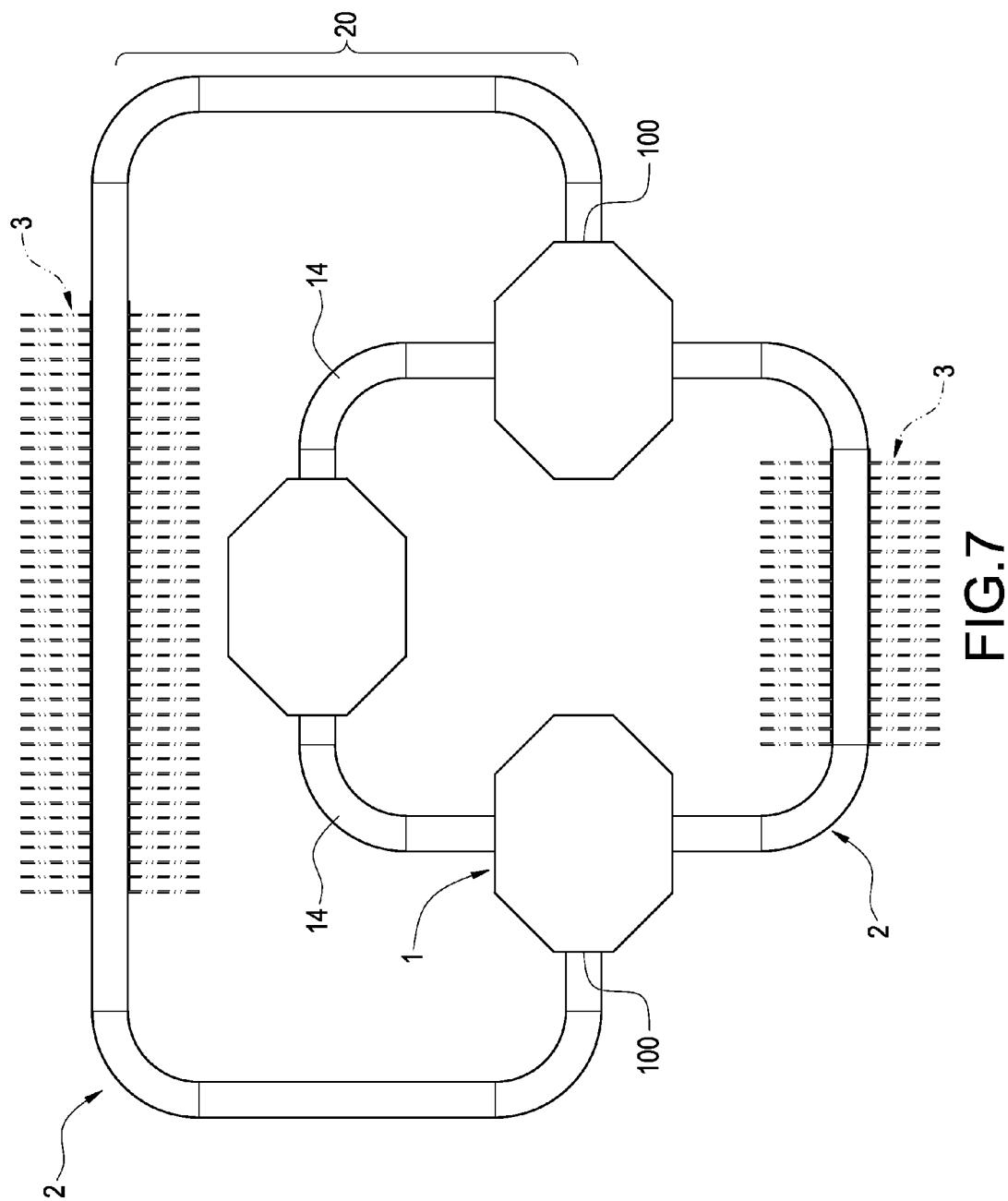
FIG. 7 is an illustrative plane view showing an internal structure of a fourth embodiment of the present invention.

Moreover, for the application where a multiple number of heat generating sources are used, the present invention can also be modified to increase the quantity of the evaporation chamber 1. As shown in FIG. 5, the quantity of the evaporation chamber is plural (such as two); and a connecting tube 14 can be used to connect between any two of the evaporation chambers 1 in order to allow the working fluid of the vapor phase at the internals of the two evaporation chambers 1 to be connected with each other. Furthermore, as shown in FIG. 6, the loop pipe 2 of the present invention can also be modified to be of a plurality of loop pipes and configured to be connected between any two of the evaporation chambers 1; at the same time, the condensation tubular portions 21 of the two loop pipes 2 can both be provided with a plurality of the aforementioned fins 3 thereon. Also, as shown in FIG. 7, considering the situation where a great number of the evaporation chambers 1 (such as three) are additionally provided, any two of the adjacent evaporation chambers 1 can be connected by a connecting pipe 14, and any two of the distant evaporation chambers can be connected by a loop pipe 2; therefore, a loop heat pipe applicable to the use of a greater number of heat generating sources can be constructed.

In view of the above, the present invention is able to achieve the objectives expected while overcoming the drawbacks of the prior arts. The present invention is of industrial applicability, novelty and inventive step such that it complies with the patentability requirements and is applied legitimately in the application in light of the grant of the patent right.

It shall be noted that the above description provides preferred embodiments of the present invention only, which shall not be treated as limitation of the scope of the present invention. Any equivalent techniques and technical modifications based on the content of the specification and drawings of the present invention shall be deemed to be within the scope of the present invention.

What is claimed is:

1. A loop heat pipe structure with a liquid and vapor separation, comprising:
   an evaporation chamber having a hollow internal and having two connecting ports connected to the internal thereof; and an inner wall of the evaporation chamber having a liquid-preservation capillary structure; and
   a loop pipe having two evaporation channel tubular portions and a condensation tubular portion connected between the two evaporation channel tubular portions; and the two evaporation channel tubular portions connected to the two connecting ports of the evaporation chamber respectively;
   wherein each one of the evaporation channel tubular portions comprises an inner tube and an outer tube; the inner tube is sleeved inside the outer tube; and a flow-returning capillary structure is disposed between the outer tube and the inner tube inside the outer tube; the flow-returning capillary structure extends into the evaporation chamber and is in contact with the liquid-preservation capillary structure;
   wherein the inner tube of each one of the evaporation channel tubular portions protrudes further than the outer tube into the evaporation chamber.

2. The loop heat pipe structure with a liquid and vapor separation according to claim 1, wherein the evaporation chamber is constructed by a base and an upper cover.

3. The loop heat pipe structure with a liquid and vapor separation according to claim 2, wherein a plurality of supporting members are further arranged between the base and the upper cover.

4. The loop heat pipe structure with a liquid and vapor separation according to claim 1, wherein the liquid-preservation capillary structure extends to an end of the outer tube protruding into the evaporation chamber in order to form a capillary covering portion.

5. The loop heat pipe structure with a liquid and vapor separation according to claim 1, wherein the liquid-preservation capillary structure is a powder sintering or metal mesh.

6. The loop heat pipe structure with a liquid and vapor separation according to claim 1, wherein the outer tube of each one of the evaporation channel tubular portions is connected to the condensation tubular portion to be integrally formed as one piece.

7. The loop heat pipe structure with a liquid and vapor separation according to claim 1, wherein the condensation portion further includes a plurality of fins formed thereon.

8. The loop heat pipe structure with a liquid and vapor separation according to claim 1, wherein a quantity of the evaporation chamber is plural.

9. The loop heat pipe structure with a liquid and vapor separation according to claim 8, wherein any one of the two evaporation chamber are connected by a connecting tube.

10. The loop heat pipe structure with a liquid and vapor separation according to claim 8, wherein a quantity of the loop pipe is plural and connected between any one of the two evaporation chambers.

\* \* \* \* \*